United States Patent
You

(10) Patent No.: US 9,640,761 B2
(45) Date of Patent: May 2, 2017

(54) ORGANIC LIGHT-EMITTING DIODE DISPLAY AND METHOD OF MANUFACTURING THE SAME

(71) Applicant: Samsung Display Co., Ltd., Yongin, Gyeonggi-Do (KR)

(72) Inventor: Chungi You, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/738,338

(22) Filed: Jun. 12, 2015

(65) Prior Publication Data

US 2016/0190454 A1    Jun. 30, 2016

(30) Foreign Application Priority Data

Dec. 30, 2014  (KR) .................. 10-2014-0194321

(51) Int. Cl.
*H01L 29/08*    (2006.01)
*H01L 51/00*    (2006.01)
(Continued)

(52) U.S. Cl.
CPC ...... *H01L 51/0017* (2013.01); *H01L 27/3248* (2013.01); *H01L 27/3262* (2013.01);
(Continued)

(58) Field of Classification Search
CPC ............. H01L 51/0017; H01L 27/3248; H01L 27/3262; H01L 27/3265; H01L 51/0023; H01L 51/5203; H01L 51/56
(Continued)

(56) References Cited

U.S. PATENT DOCUMENTS 6,828,726 B2 * 12/2004 Sakurai ............... H01L 27/3246
313/498
6,844,215 B1    1/2005 Ghosh
(Continued)

FOREIGN PATENT DOCUMENTS

KR    10-2009-0127715 A    12/2009
KR    10-2011-0057592 A    6/2011
(Continued)

OTHER PUBLICATIONS

USPTO NFOA dated Aug. 18, 2016 in connection with U.S. Appl. No. 14/738,526.

*Primary Examiner* — Xinning Niu
*Assistant Examiner* — Vu A Vu
(74) *Attorney, Agent, or Firm* — Ladas & Parry LLP

(57) ABSTRACT

An organic light-emitting diode (OLED) display and a method of manufacturing the same are disclosed. In one aspect, the method includes performing a first mask process of forming an active layer of a thin-film transistor (TFT) over a substrate and performing a second mask process of i) forming a gate insulating layer over the active layer and ii) forming a gate electrode of the TFT over the gate insulating layer. The method also includes performing a third mask process of i) forming an interlayer insulating layer over the gate electrode and ii) forming a contact hole in the interlayer insulating layer so as to expose a portion of the active layer and performing a fourth mask process of forming a pixel electrode over the interlayer insulating layer.

20 Claims, 8 Drawing Sheets

(51) Int. Cl.
  *H01L 27/32* (2006.01)
  *H01L 51/56* (2006.01)
  *H01L 51/52* (2006.01)
  *H01L 51/05* (2006.01)
  *H01L 51/10* (2006.01)

(52) U.S. Cl.
  CPC ...... *H01L 27/3265* (2013.01); *H01L 51/0023* (2013.01); *H01L 51/055* (2013.01); *H01L 51/105* (2013.01); *H01L 51/5203* (2013.01); *H01L 51/56* (2013.01)

(58) Field of Classification Search
  USPC ............................................................ 257/40
  See application file for complete search history.

(56) References Cited

U.S. PATENT DOCUMENTS

| | | | | |
|---|---|---|---|---|
| 6,953,951 B2* | 10/2005 | Yamazaki | ........... | G02F 1/13454 257/347 |
| 7,999,468 B2* | 8/2011 | Lee | ..................... | H01L 51/5237 313/505 |
| 8,106,402 B2* | 1/2012 | Yeo | ..................... | H01L 27/3248 257/59 |
| 8,203,264 B2* | 6/2012 | Kang | .................. | H01L 27/3258 257/59 |
| 2008/0233665 A1 | 9/2008 | Jung et al. | | |
| 2009/0302332 A1 | 12/2009 | Kang et al. | | |
| 2011/0053301 A1* | 3/2011 | Kang | ...................... | C23C 14/12 438/34 |
| 2011/0121302 A1 | 5/2011 | Lee et al. | | |
| 2012/0007083 A1 | 1/2012 | You et al. | | |
| 2012/0146031 A1 | 6/2012 | Lee | | |
| 2012/0193624 A1* | 8/2012 | You | ....................... | H01L 27/124 257/57 |
| 2013/0056710 A1* | 3/2013 | Oh | ...................... | H01L 27/1255 257/40 |
| 2013/0119388 A1* | 5/2013 | Lee | ..................... | H01L 51/5265 257/59 |
| 2013/0175533 A1 | 7/2013 | Lee et al. | | |
| 2013/0335906 A1 | 12/2013 | Shamassian et al. | | |
| 2016/0141346 A1 | 5/2016 | You | | |
| 2016/0190454 A1 | 6/2016 | You | | |

FOREIGN PATENT DOCUMENTS

| | | |
|---|---|---|
| KR | 10-2012-0063745 A | 6/2012 |
| KR | 10-2013-0080642 | 7/2013 |

* cited by examiner

ORGANIC LIGHT-EMITTING DIODE DISPLAY AND METHOD OF MANUFACTURING THE SAME

RELATED APPLICATION

This application claims the benefit of Korean Patent Application No. 10-2014-0194321, filed on Dec. 30, 2014, in the Korean Intellectual Property Office, the disclosure of which is incorporated herein in its entirety by reference. This application relates to U.S. patent application entitled "Organic Light-Emitting Diode Display and Method of Manufacturing the Same" (application Ser. No. 14/738,526; published Jun. 30, 2016, which is concurrently filed with this application and incorporated herein by reference in its entirety.

BACKGROUND

Field

The described technology generally relates to an organic light-emitting diode display and a method of manufacturing the same.

Description of the Related Technology

An organic light-emitting diode (OLED) display includes a hole injection electrode, an electron injection electrode, and an emission layer formed therebetween. Holes injected from the hole injection electrode and electrons injected from the electron injection electrode are re-combined in the emission layer so that light is emitted therefrom. The display is considered to be a next generation display due to its favorable characteristics such as low power consumption, high contrast, a fast response time, and so forth.

SUMMARY OF CERTAIN INVENTIVE ASPECTS

One inventive aspect relates to an OLED display with reduced defects and manufacturing costs, and a method of manufacturing the OLED display.

Another aspect is a method of manufacturing an OLED display that includes operations of performing a first mask process for forming an active layer of a thin-film transistor on a substrate; performing a second mask process for forming a gate insulating layer on the active layer and forming a gate electrode of the thin-film transistor on the gate insulating layer; performing a third mask process for forming an interlayer insulating layer on the gate electrode and forming a contact hole in the interlayer insulating layer so as to expose a portion of the active layer; performing a fourth mask process for forming a pixel electrode on the interlayer insulating layer; performing a fifth mask process for forming a source electrode and a drain electrode, wherein one of the source electrode and the drain electrode directly contacts a top surface of the pixel electrode, and the source electrode and the drain electrode are formed by dry etching; and performing a sixth mask process for forming a pixel-defining layer that covers ends of the pixel electrode.

After the second mask process, the method can further include an operation of doping a region of the active layer with ion impurities, wherein the region of the active layer does not overlap with the gate electrode.

The second mask process can include an operation of forming the gate electrode by dry etching.

The operation of forming the gate electrode can include an operation of dry etching a first layer comprising titanium (Ti), a second layer comprising aluminum (Al), and a third layer comprising Ti.

The operation of forming each of the source electrode and the drain electrode can include an operation of dry etching a first layer comprising Ti, a second layer comprising Al, and a third layer comprising Ti.

The sixth mask process can include an operation of forming an opening in the pixel-defining layer, and the opening can expose the top surface of the pixel electrode and can be formed in a region that does not overlap with the thin-film transistor.

The second mask process can include an operation of simultaneously forming a first electrode of a capacitor and the gate electrode, and the fourth mask process can include an operation of simultaneously forming a second electrode of the capacitor and the source and drain electrodes.

The fourth mask process can include an operation of simultaneously forming a pad electrode and the source and drain electrodes on a same layer.

The sixth mask process can include an operation of forming the pixel-defining layer such that a thickness of the pixel-defining layer where the pixel-defining layer covers ends of the pad electrode can be less than a thickness of the pixel-defining layer where the pixel-defining layer covers the source electrode and the drain electrode.

The sixth mask process can include an operation of forming the pixel-defining layer by using a half-tone mask.

After the sixth mask process, the method can further include operations of performing a process for forming an emission layer on the pixel electrode; and performing a process for forming an opposite electrode on the emission layer.

The pixel electrode can be a translucent electrode, and the opposite electrode can be a reflective electrode.

The operation of forming the pixel electrode can include an operation of sequentially stacking a first transparent conductive oxide layer, a translucent metal layer, and a second transparent conductive oxide layer from the interlayer insulating layer.

The translucent metal layer can include silver (Ag) or a silver alloy.

Each of the first and second transparent conductive oxide layers can include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

Another aspect is an OLED display that includes a substrate; a thin-film transistor comprising an active layer, a gate electrode, a source electrode, and a drain electrode that are formed on the substrate; a capacitor comprising a first electrode formed on a same layer as the gate electrode, and a second electrode formed on a same layer as the source electrode and the drain electrode; a pad electrode formed on the same layer as the source electrode and the drain electrode; a pixel electrode formed at a position that does not overlap with the thin-film transistor and the capacitor, wherein one of the source electrode and the drain electrode directly contacts a portion of a top surface of the pixel electrode; a pixel-defining layer having different thicknesses to cover ends of the pixel electrode and ends of the pad electrode; an emission layer formed on the pixel electrode; and an opposite electrode formed on the emission layer.

The pixel electrode can be a translucent electrode, and the opposite electrode can be a reflective electrode.

The pixel electrode can be formed by sequentially stacking a first transparent conductive oxide layer, a translucent metal layer, and a second transparent conductive oxide layer from the substrate.

Each of the first and second transparent conductive oxide layers can include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The translucent metal layer can include silver (Ag) or a silver alloy.

Another aspect is a method of manufacturing an organic light-emitting diode (OLED) display, the method comprising: performing a first mask process of forming an active layer of a thin-film transistor (TFT) over a substrate; performing a second mask process of i) forming a gate insulating layer over the active layer and ii) forming a gate electrode of the TFT over the gate insulating layer; performing a third mask process of i) forming an interlayer insulating layer over the gate electrode and ii) forming a contact hole in the interlayer insulating layer so as to expose a portion of the active layer; performing a fourth mask process of forming a pixel electrode over the interlayer insulating layer; performing a fifth mask process of forming source and drain electrodes via dry etching, wherein one of the source and drain electrodes directly contacts a top surface of the pixel electrode; and performing a sixth mask process of forming a pixel-defining layer at least partially covering ends of the pixel electrode.

The above method further comprises, after the second mask process, doping a region of the active layer with ion impurities, wherein the region of the active layer does not overlap the gate electrode.

In the above method, the second mask process comprises forming the gate electrode via dry etching.

In the above method, the forming of the gate electrode comprises dry etching a first layer formed of titanium (Ti), a second layer formed of aluminum (Al), and a third layer formed of Ti.

In the above method, the forming of each of the source and drain electrodes comprises dry etching a first layer formed of Ti, a second layer formed of Al, and a third layer formed of Ti.

In the above method, the sixth mask process comprises forming an opening in the pixel-defining layer, wherein the opening exposes a top surface of the pixel electrode and is formed in a region that does not overlap the TFT.

In the above method, the second mask process comprises concurrently forming a first electrode of a capacitor and the gate electrode, wherein the fourth mask process comprises concurrently forming a second electrode of the capacitor and the source and drain electrodes.

In the above method, the fourth mask process comprises concurrently forming a pad electrode and the source and drain electrodes on the same layer.

In the above method, the sixth mask process comprises forming the pixel-defining layer such that the thickness of the pixel-defining layer, where the pixel-defining layer covers ends of the pad electrode, is less than the thickness of the pixel-defining layer, where the pixel-defining layer covers the source and drain electrodes.

In the above method, the sixth mask process comprises forming the pixel-defining layer via a half-tone mask.

The above method further comprises, after the sixth mask process: performing a process of forming an emission layer over the pixel electrode; and performing a process of forming an opposite electrode over the emission layer.

In the above method, the pixel electrode is a translucent electrode, wherein the opposite electrode is a reflective electrode.

In the above method, the forming of the pixel electrode comprises a first transparent conductive oxide layer, a translucent metal layer, and a second transparent conductive oxide layer sequentially stacked over the interlayer insulating layer.

In the above method, the translucent metal layer is formed of silver (Ag) or a silver alloy.

In the above method, each of the first and second transparent conductive oxide layers is formed of at least one of indium tin oxide (ITO), indium zinc oxide (IZO), zinc oxide (ZnO), indium oxide (In2O3), indium gallium oxide (IGO), and aluminum zinc oxide (AZO).

Another aspect is an organic light-emitting diode (OLED) display comprising: a substrate; a thin-film transistor (TFT) comprising an active layer, a gate electrode, a source electrode, and a drain electrode that are formed over the substrate; a capacitor comprising i) a first electrode formed on the same layer as the gate electrode and ii) a second electrode formed on the same layer as the source and drain electrodes; a pad electrode formed on the same layer as the source and drain electrodes; a pixel electrode formed at a position that does not overlap the TFT and the capacitor, wherein one of the source and drain electrodes directly contacts a portion of a top surface of the pixel electrode; a pixel-defining layer having different thicknesses and at least partially covering ends of the pixel electrode and ends of the pad electrode; an emission layer formed over the pixel electrode; and an opposite electrode formed over the emission layer.

In the above display, the pixel electrode is a translucent electrode, wherein the opposite electrode is a reflective electrode.

In the above display, the pixel electrode comprises a first transparent conductive oxide layer, a translucent metal layer, and a second transparent conductive oxide layer sequentially stacked over the substrate.

In the above display, each of the first and second transparent conductive oxide layers is formed of at least one of indium tin oxide (ITO), indium zinc oxide (IZO), zinc oxide (ZnO), indium oxide (In2O3), indium gallium oxide (IGO), and aluminum zinc oxide (AZO).

In the above display, the translucent metal layer is formed of silver (Ag) or a silver alloy.

DETAILED DESCRIPTION OF CERTAIN INVENTIVE EMBODIMENTS

Figure 1:
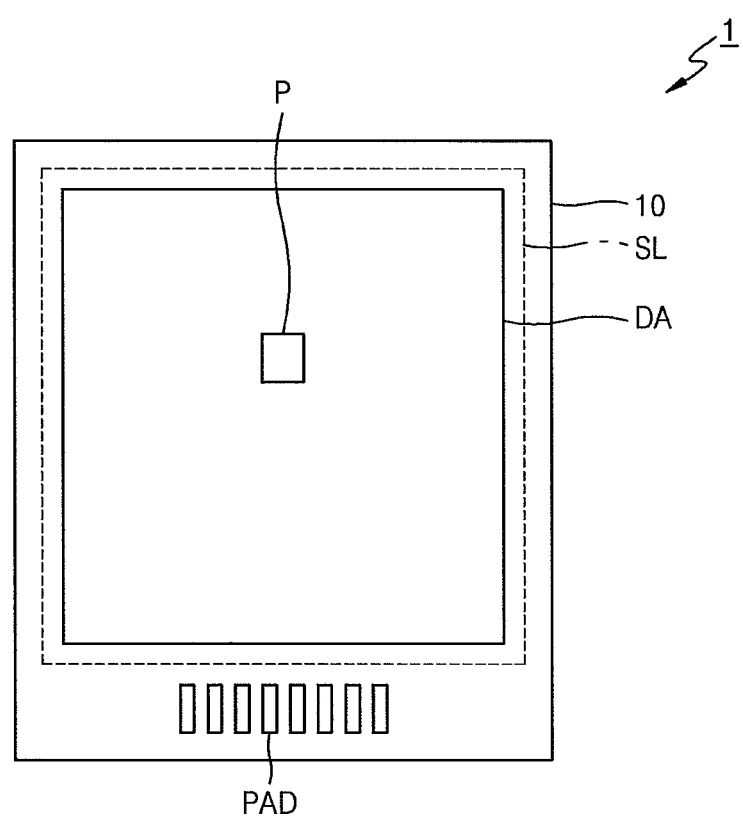
FIG. 1 is a plan view of an OLED display according to a first exemplary embodiment.

As the described technology allows for various changes and numerous embodiments, particular embodiments will be illustrated in the drawings and described in detail in the written description. Effects and features of the described technology and methods of accomplishing the same can be understood more readily by reference to the following detailed description of exemplary embodiments and the accompanying drawings. The described technology can, however, be embodied in many different forms and should not be construed as being limited to the embodiments set forth herein.

Hereinafter, one or more exemplary embodiments will be described below in more detail with reference to the accompanying drawings. Those components that are the same or are in correspondence are rendered the same reference numeral regardless of the figure number, and redundant explanations are omitted.

Hereinafter, in one or more exemplary embodiments, while such terms as "first," "second," etc., can be used, but such components must not be limited to the above terms, and the above terms are used only to distinguish one component from another.

Hereinafter, in one or more exemplary embodiments, a singular form can include plural forms, unless there is a particular description contrary thereto.

Hereinafter, in one or more exemplary embodiments, terms such as "comprise" or "comprising" are used to specify existence of a recited feature or component, not excluding the existence of one or more other recited features or one or more other components.

Hereinafter, in one or more exemplary embodiments, it will also be understood that when an element such as layer, region, or component is referred to as being "on" another element, it can be directly on the other element, or intervening elements such as layer, region, or component can also be interposed therebetween.

In the drawings, for convenience of description, the sizes of layers and regions are exaggerated for clarity. For example, a size and thickness of each element can be random for convenience of description, thus, one or more exemplary embodiments are not limited thereto.

As used herein, the term "and/or" includes any and all combinations of one or more of the associated listed items. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 2:
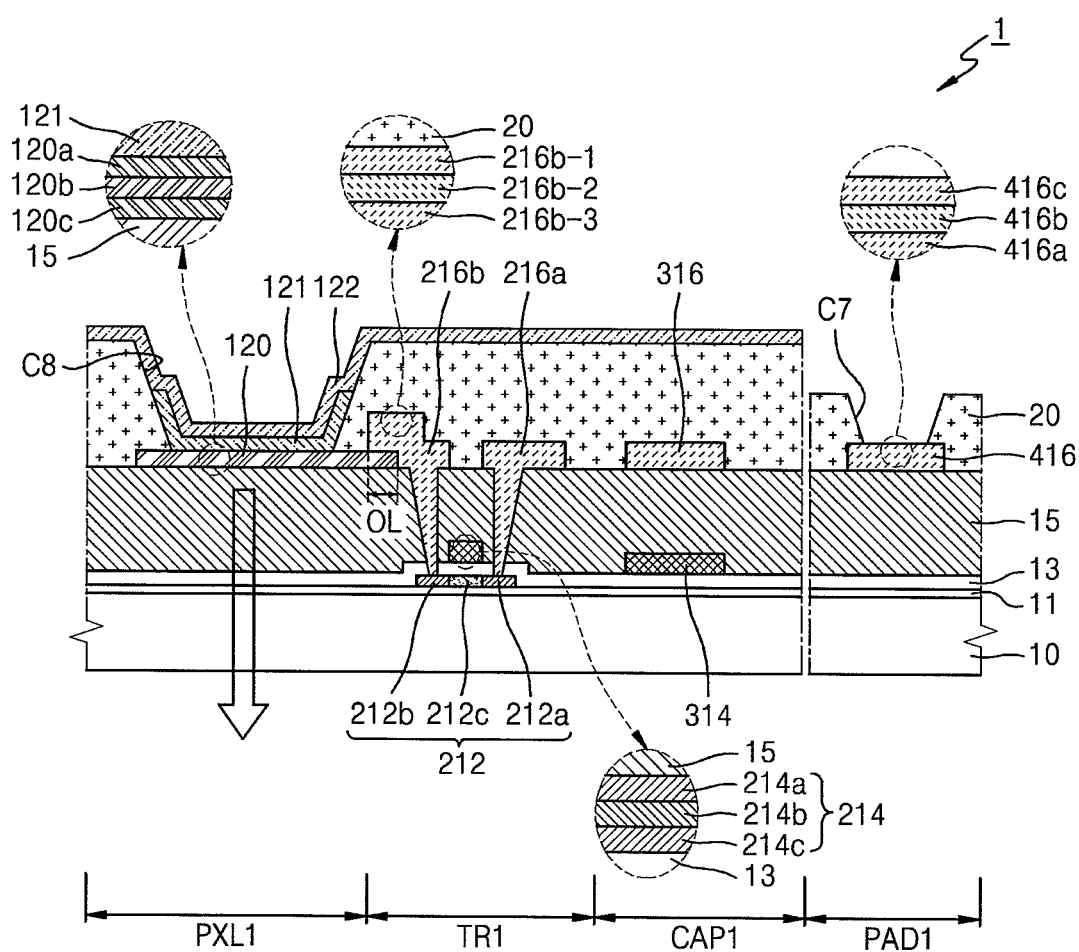
FIG. 2 is a cross-sectional view illustrating a portion of an emission pixel and a portion of a pad of the OLED display according to the first exemplary embodiment.

FIG. 1 is a plan view of an OLED display 1 according to a first exemplary embodiment. FIG. 2 is a cross-sectional view illustrating a portion of an emission pixel and a portion of a pad of the OLED display 1 according to the first exemplary embodiment.

Referring to FIG. 1, the OLED display 1 includes a display area DA on a substrate 10, and the display area DA includes a plurality of pixels P and thus displays an image. The display area DA is formed within a sealing line SL, and an encapsulation member (not shown) is arranged to encapsulate the display area DA along the sealing line SL.

Referring to FIG. 2, a pixel region PXL1 having at least one emission layer 121, a thin-film transistor region TR1 having at least one thin-film transistor, a capacitor region CAP1 having at least one capacitor, and a pad region PAD1 are arranged on the substrate 10.

In the thin-film transistor region TR1, an active layer 212 of the thin-film transistor (TFT) is arranged above the substrate 10 and a buffer layer 11.

The substrate 10 can be formed as a transparent substrate including a glass substrate or a plastic substrate formed of polyethylene terephthalate (PET), polyethylene naphthalate (PEN), polyimide, or the like.

The buffer layer 11 can be further arranged on the substrate 10 so as to form a planar surface on the substrate 10 and to prevent penetration of foreign substances. The buffer layer 11 can be formed as a single layer or multiple layers formed of silicon nitride and/or silicon oxide.

The active layer 212 is arranged on the buffer layer 11 in the thin-film transistor region TR1. The active layer 212 can be formed of a semiconductor including amorphous silicon or polysilicon. The active layer 212 can include a channel region 212c, and a source region 212a and a drain region 212b that are arranged at both sides of the channel region 212c and doped with ion impurity. A material of the active layer 212 is not limited to amorphous silicon or polysilicon and can include an oxide semiconductor.

A gate insulating layer 13 is arranged on the active layer 212. The gate insulating layer 13 can be formed as a single layer or multiple layers including silicon nitride and/or silicon oxide.

A gate electrode 214 is arranged on the gate insulating layer 13.

In some embodiments, the gate electrode 214 includes a first layer 214a formed of titanium (Ti), a second layer 214b formed of aluminum (Al), and a third layer 214c formed of Ti. The first to third layers 214a-214c can be collectively patterned by dry etching.

Although not illustrated in FIG. 2, a wiring such as a scan line can be formed on the same layer as the gate electrode 214 and formed of the same material as the gate electrode 214.

As the screen size of the OLED display 1 increases, the thickness of the wiring increases so as to prevent signal delay due to large wire runs. In some embodiments, the thickness of the gate electrode 214 and the wiring are set in the range of about 6,000 Å to about 12,000 Å. The above range can provide an optimum balance between prevention of signal delays and difficulty of forming thicker layers via deposition. However, depending on the embodiments, the thickness can be less than about 6,000 Å or greater than about 12,000 Å.

An interlayer insulating layer 15 is deposited on the gate electrode 214. The interlayer insulating layer 15 can be formed as a single layer or multiple layers formed of silicon nitride and/or silicon oxide.

A source electrode 216a and a drain electrode 216b are arranged on the interlayer insulating layer 15.

In some embodiments, the drain electrode 216b includes a first layer 216b-1 formed of Ti, a second layer 216b-2 formed of Al, and a third layer 216b-3 formed of Ti. Although not illustrated in drawings, the source electrode 216a can have a same stack structure as that of the drain electrode 216b.

The source electrode 216a and the drain electrode 216b that include the first to third layers 216b-1 to 216b-3 can be collectively patterned by dry etching.

A pixel-defining layer 20 that covers the source electrode 216a and the drain electrode 216b is formed over the source electrode 216a and the drain electrode 216b.

The pixel-defining layer 20 can be formed of polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinyl alcohol-based polymer, or a combination thereof.

A pixel electrode 120 contacts one of the source electrode 216a and the drain electrode 216b. Referring to FIG. 2, the pixel electrode 120 directly contacts the drain electrode 216b but one or more embodiments are not limited thereto. That is, the pixel electrode 120 can directly contact the source electrode 216a.

The pixel electrode 120 is arranged on the interlayer insulating layer 15 in the pixel region PXL1.

The pixel electrode 120 includes a translucent metal layer 120b. Also, the pixel electrode 120 can include a first transparent conductive oxide layer 120a formed below the translucent metal layer 120b, and a second transparent conductive oxide layer 120c formed on the translucent metal layer 120b.

The translucent metal layer 120b can be formed of silver (Ag) or a silver alloy. The translucent metal layer 120b and an opposite electrode 122 that is a reflective electrode to be described later can form a micro-cavity structure and thus can improve a luminescent efficiency of the OLED display 1.

Each of the first and second transparent conductive oxide layers 120a and 120c can be formed of at least one of indium tin oxide (ITO), indium zinc oxide (IZO), zinc oxide (ZnO), indium oxide ($In_2O_3$), indium gallium oxide (IGO), and aluminum zinc oxide (AZO).

The first transparent conductive oxide layer 120a can reinforce adhesion between the interlayer insulating layer 15 and the translucent metal layer 120b, and the second transparent conductive oxide layer 120c can function as a barrier layer for protecting the translucent metal layer 120b.

A bottom surface of the pixel electrode 120 can directly contact a top surface of the interlayer insulating layer 15.

A portion of an end of the pixel electrode 120 and a portion of the drain electrode 216b directly contact in an overlapping region OL. A bottom surface of the drain electrode 216b directly contacts a top surface of the pixel electrode 120 in the overlapping region OL.

Ends of the pixel electrode 120 are at least partially covered by the pixel-defining layer 20.

An opening C8 for exposing the top surface of the pixel electrode 120 is formed in a region of the pixel-defining layer 20 that does not overlap with the thin-film transistor and the capacitor. A thickness of the pixel-defining layer 20 that covers the ends of the pixel electrode 120, the source electrode 216a, and the drain electrode 216b can be in the range of about 50 μm to about 70 μm. However, depending on the embodiments, the thickness can be less than about 50 μm or greater than about 70 μm.

An intermediate layer (not shown) that includes the emission layer 121 is arranged on the pixel electrode 120 whose top surface is exposed by the opening C8. The emission layer 121 can be formed of a small molecule organic material or a polymer organic material.

If the emission layer 121 is formed of the small molecule organic material, the intermediate layer can further include a hole transport layer (HTL), a hole injection layer (HIL), an electron transport layer (ETL), or an electron injection layer (EIL). In addition to these layers, if required, the intermediate layer can further include various layers. Here, various organic materials including copper phthalocyanine (CuPc), N,N'-Di(naphthalene-1-yl)-N,N'-diphenyl-benzidine (NPB), tris-8-hydroxyquinoline aluminum)(Alq3), or the like can be used.

The opposite electrode 122 can be the reflective electrode formed of a reflective material. The opposite electrode 122 can be formed of at least one material selected from Al, Mg, Li, Ca, LiF/Ca, and LiF/Al. Since the opposite electrode 122 is formed as the reflective electrode, light that is emitted from the emission layer 121 is reflected from the opposite electrode 122 and thus is discharged toward the substrate 10 via the pixel electrode 120 formed of translucent metal.

The opposite electrode 122 is not separately formed in each pixel but is formed as a common electrode that wholly covers the display area DA (refer to FIG. 1).

Due to the micro-cavity structure, a color shift can occur in a light that is discharged toward the substrate 10. The color shift can be affected from a material and a thickness of the interlayer insulating layer 15. In some embodiments, a silicon oxide layer of about 3,000 Å is formed near the substrate 10, and a silicon nitride layer of about 3,000 Å is formed near the pixel electrode 120. By doing so, the interlayer insulating layer 15 having a total thickness of about 6,000 Å is formed, so that a problem of the color shift is improved.

A first electrode 314 can be formed of the same material as the gate electrode 214.

A second electrode 316 can be formed of the same material as the source electrode 216a and the drain electrode 216b.

In the pad region PAD1 that is an outer region of the display area DA, a pad electrode 416 that is a connection terminal of an external driver is positioned. That is, the pad electrode 416 can include a first layer 416a formed of Ti, a second layer 416b formed of Al, and a third layer 416c formed of Ti. The first to third layers 416a-416c can be collectively patterned by dry etching.

The pad electrode 416 is formed over the interlayer insulating layer 15, and ends of the pad electrode 416 are covered by the pixel-defining layer 20.

A thickness of the pixel-defining layer 20 where the pixel-defining layer 20 covers the ends of the pad electrode 416 is less than a thickness of the pixel-defining layer 20 where the pixel-defining layer 20 covers the source electrode 216a, the drain electrode 216b, and the second electrode 316 in the thin-film transistor region TR1 and the capacitor region CAP1.

The pixel-defining layer 20 covers the ends of the pad electrode 416 and thus prevents the ends of the pad electrode 416 from deteriorating. However, if a thickness of the pixel-defining layer 20 is great, when the external driver is connected, a connection error can occur. Therefore, the thickness of the pixel-defining layer 20 where the pixel-defining layer 20 covers the ends of the pad electrode 416 can be less than the thickness of the pixel-defining layer 20 where the pixel-defining layer 20 covers the source electrode 216a and the drain electrode 216.

Although not illustrated in FIG. 2, the OLED display 1 can further include an encapsulation member (not shown) that encapsulates the display area DA including the pixel region PXL1, the capacitor region CAP1, and the thin-film transistor region TR1.

The encapsulation member can be formed as a substrate formed of a glass material, a metal film, or an encapsulation layer indicating an organic insulating layer and an inorganic insulating layer that are alternately formed.

Hereinafter, a method of manufacturing the OLED display 1 will be described with reference to FIGS. 3A through 3F.

Figure 3A:
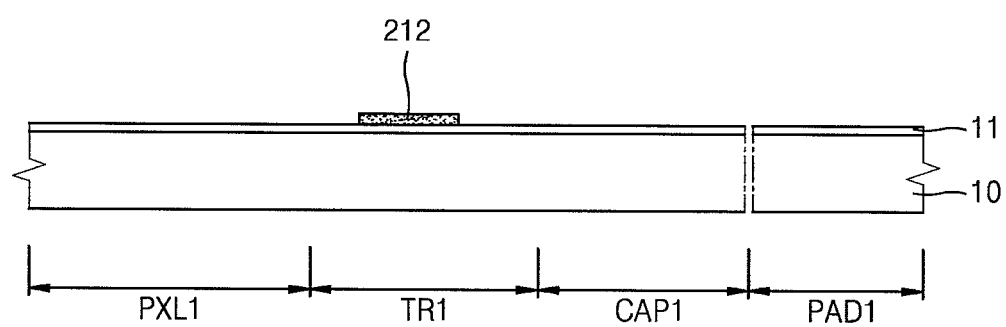
FIG. 3A is a cross-sectional view illustrating a resultant of a first mask process for the OLED display, according to an exemplary embodiment.

FIG. 3A is a cross-sectional view illustrating a resultant of a first mask process for the OLED display 1, according to an exemplary embodiment.

Referring to FIG. 3A, the buffer layer 11 is formed on the substrate 10, and a semiconductor layer (not shown) is formed on the buffer layer 11 and is patterned, so that the active layer 212 of a thin-film transistor is formed.

Although not illustrated, after photoresist (not shown) is coated on the semiconductor layer, the semiconductor layer is patterned via a photolithography process using a first photomask (not shown), so that the active layer 212 is formed. The first mask process using the photolithography process is processed in a manner that the first photomask is exposed by an exposure device (not shown), and then developing, etching, and stripping or ashing processes are sequentially performed.

The semiconductor layer can be formed of amorphous silicon or polysilicon. Here, the polysilicon can be formed by crystallizing the amorphous silicon. The crystallization of the amorphous silicon can be performed by using various methods including a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, and the like. However, a material of the semiconductor layer is not limited to the amorphous silicon or the polysilicon and the semiconductor layer can include an oxide semiconductor.

Figure 3B:
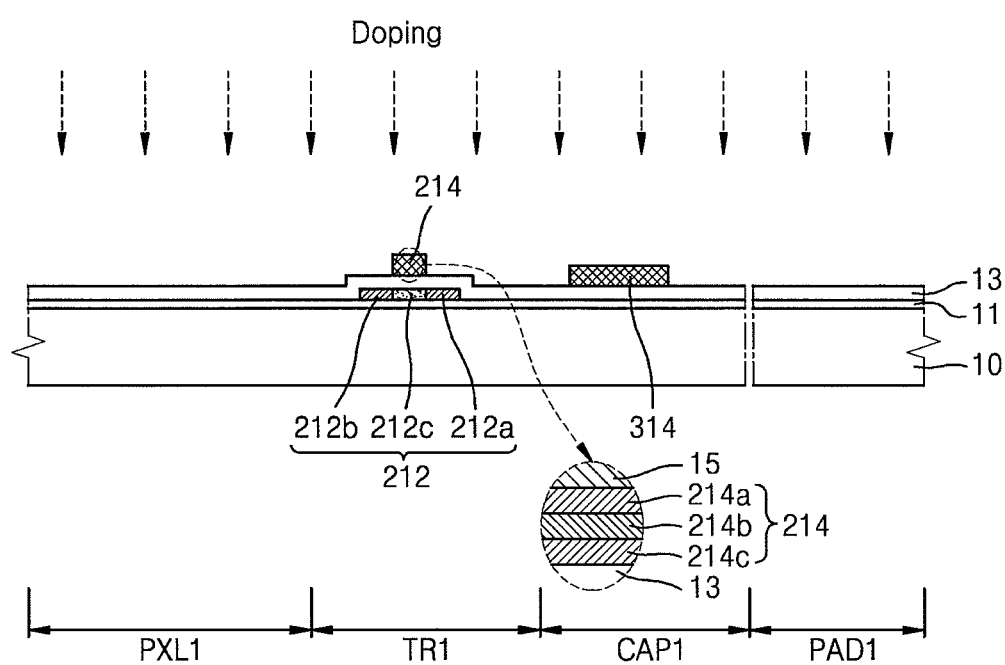
FIG. 3B is a cross-sectional view illustrating a resultant of a second mask process for the OLED display, according to an exemplary embodiment.

FIG. 3B is a cross-sectional view illustrating a resultant of a second mask process for the OLED display 1, according to an exemplary embodiment.

The gate insulating layer 13 is formed on the resultant of the first mask process shown in FIG. 3A, and a first metal layer (not shown) is formed on the gate insulating layer 13 and is patterned.

In some embodiment, a first layer 214a formed of Ti, a second layer 214b formed of Al, and a third layer 214c formed of Ti are sequentially formed as the first metal layer on the gate insulating layer 13 and are collectively etched. Here, not wet etching but dry etching is performed.

Since wirings (not shown) such as the gate electrode 214, a scan line, etc. are formed by patterning the first metal layer via dry etching, a profile of an etched surface can be substantially uniform in comparison to wet etching.

As a size of a screen of the OLED display 1 is increased, it is required to increase a thickness of the wiring so as to prevent a signal delay due to the large screen. In some embodiments, a thickness of the gate electrode 214 and the wiring can be set in the range of about 6,000 Å to about 12,000 Å. However, depending on the embodiments, the thickness can be less than about 6,000 Å or greater than about 12,000 Å.

As a patterning result, the gate electrode 214 and the first electrode 314 of the capacitor are formed on the gate insulating layer 13.

Ion impurity is doped on the aforementioned structure. The ion impurity including b-type ion or p-type ion can be doped, and in more detail, the ion impurity with a density of at least $1 \times 10^{15}$ atoms/cm$^2$ is doped while targeting the active layer 212 of the thin-film transistor.

The active layer 212 is doped with the ion impurity by using the gate electrode 214 as a self-align mask, so that the active layer 212 has the source region 212a and the drain region 212b, and the channel region 212c therebetween that are doped with the ion impurity.

Figure 3C:
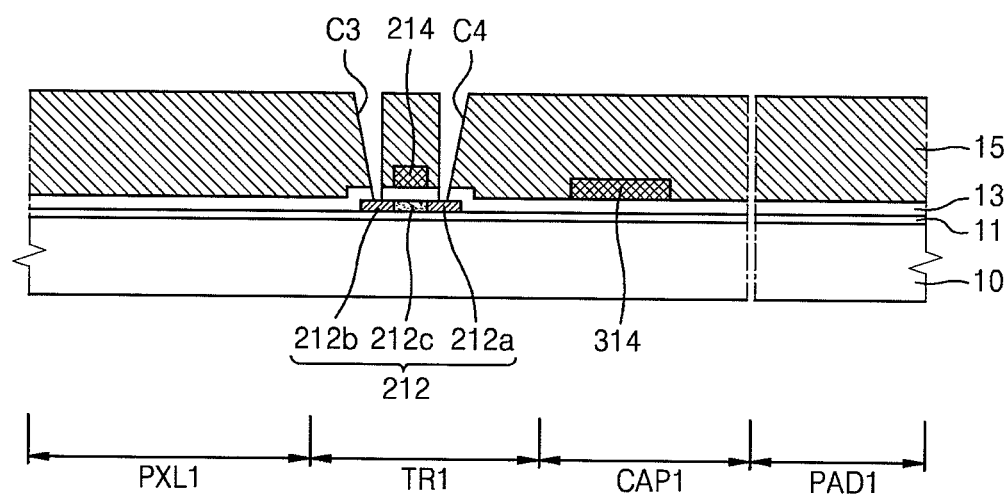
FIG. 3C is a cross-sectional view illustrating a resultant of a third mask process for the OLED display, according to an exemplary embodiment.

FIG. 3C is a cross-sectional view illustrating a resultant of a third mask process for the OLED display 1, according to an exemplary embodiment.

The interlayer insulating layer 15 is formed on the resultant of the second mask process shown in FIG. 3B, and is patterned, so that openings C3 and C4 for exposing the source region 212a and the drain region 212b of the active layer 212 are formed.

Figure 3D:
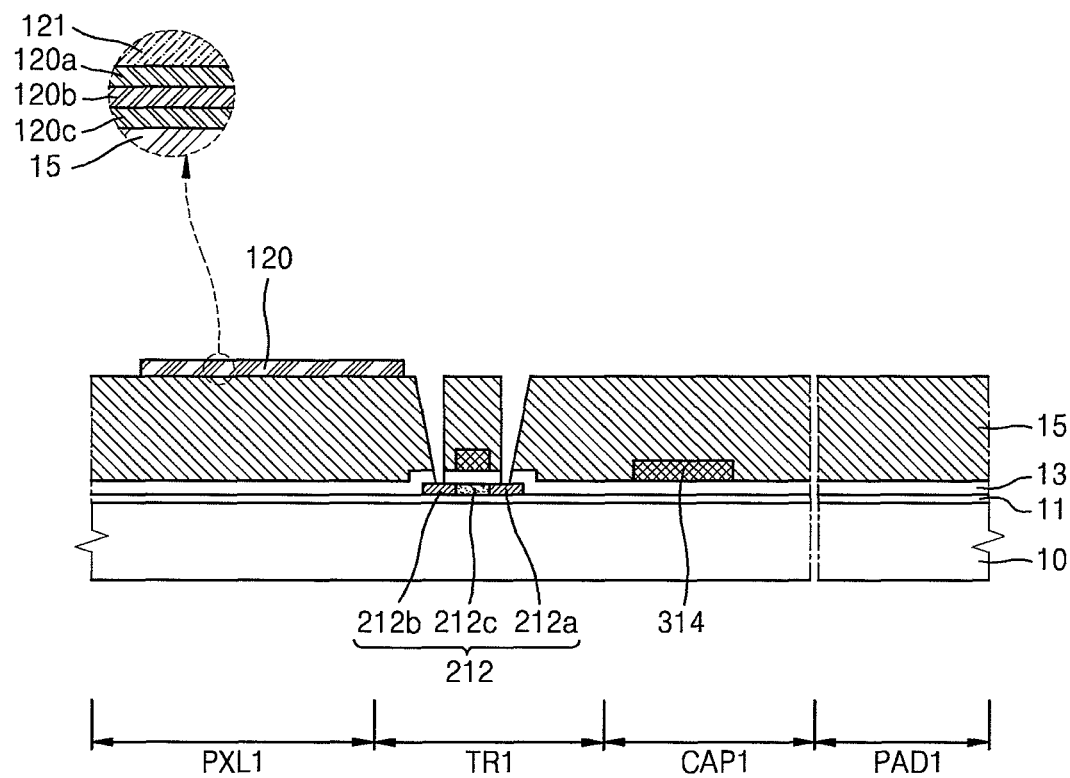
FIG. 3D is a cross-sectional view illustrating a resultant of a fourth mask process for the OLED display, according to an exemplary embodiment.

FIG. 3D is a cross-sectional view illustrating a resultant of a fourth mask process for the OLED display 1, according to an exemplary embodiment.

Referring to FIG. 3D, the first transparent conductive oxide layer 120a, the translucent metal layer 120b, and the second transparent conductive oxide layer 120c are sequentially formed on the resultant of the third mask process shown in FIG. 3C, and are substantially simultaneously or concurrently patterned, so that the pixel electrode 120 is formed.

The translucent metal layer 120b can be formed of silver (Ag) or a silver alloy.

Each of the first and second transparent conductive oxide layers 120a and 120c can be formed of at least one material selected from the group consisting of ITO, IZO, ZnO, In$_2$O$_3$, IGO, and AZO.

The first transparent conductive oxide layer 120a can reinforce adhesion between the interlayer insulating layer 15 and the translucent metal layer 120b, and the second transparent conductive oxide layer 120c can function as a barrier layer for protecting the translucent metal layer 120b.

Figure 3E:
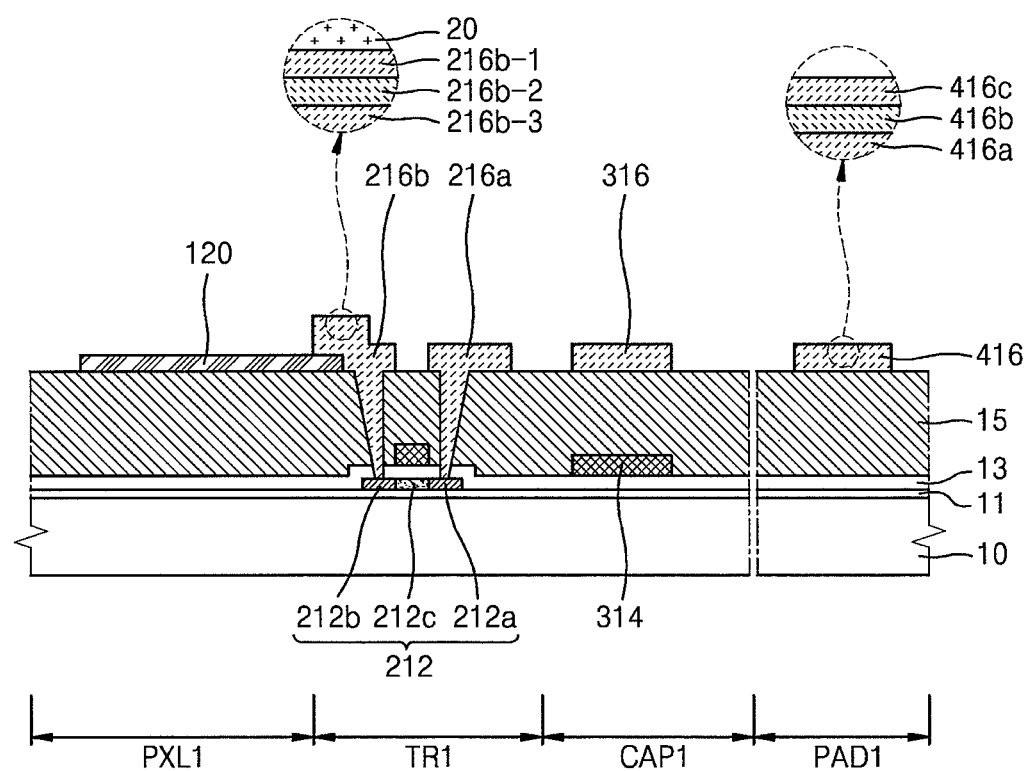
FIG. 3E is a cross-sectional view illustrating a resultant of a fifth mask process for the OLED display, according to an exemplary embodiment.

FIG. 3E is a cross-sectional view illustrating a resultant of a fifth mask process for the OLED display 1, according to an exemplary embodiment.

Referring to FIG. 3E, a second metal layer (not shown) is formed on the resultant of the fourth mask process shown in FIG. 3D, and is patterned by dry etching, such that the source electrode 216a, the drain electrode 216b, the second electrode 316 of a capacitor, and the pad electrode 416 are substantially simultaneously or concurrently formed.

The source electrode 216a, the drain electrode 216b, the second electrode 316 of the capacitor, and the pad electrode 416 can be patterned by using the same material during the same mask process.

For example, the drain electrode 216b includes a first layer 216b-1 formed of Ti, a second layer 216b-2 formed of Al, and a third layer 216b-3 formed of Ti, and the pad electrode 416 can include a first layer 416a formed of Ti, a second layer 416b formed of Al, and a third layer 416c formed of Ti.

Here, a portion of an end of the pixel electrode 120 and a portion of the drain electrode 216b can directly contact in an overlapping region OL. A bottom surface of the drain electrode 216b can directly contact a top surface of the pixel electrode 120 in the overlapping region OL.

If the pixel electrode 120 formed of a metal material, such as silver that is highly reducible, is first formed before the source electrode 216a, the drain electrode 216b, the second electrode 314, and the pad electrode 416 are formed, and then the source electrode 216a, the drain electrode 216b, the second electrode 314, and the pad electrode 416 are wet etched, silver removed from the pixel electrode 120 is re-extracted as silver particles during wet etching, and one or more particle defects can result. However, in some embodiments, if the source electrode 216a, the drain electrode 216b, the second electrode 314, and the pad electrode 416 are dry etched, a problem due to the re-extraction of the silver particle does not occur. Therefore, a particle defect of the OLED display 1 can be decreased.

Figure 3F:
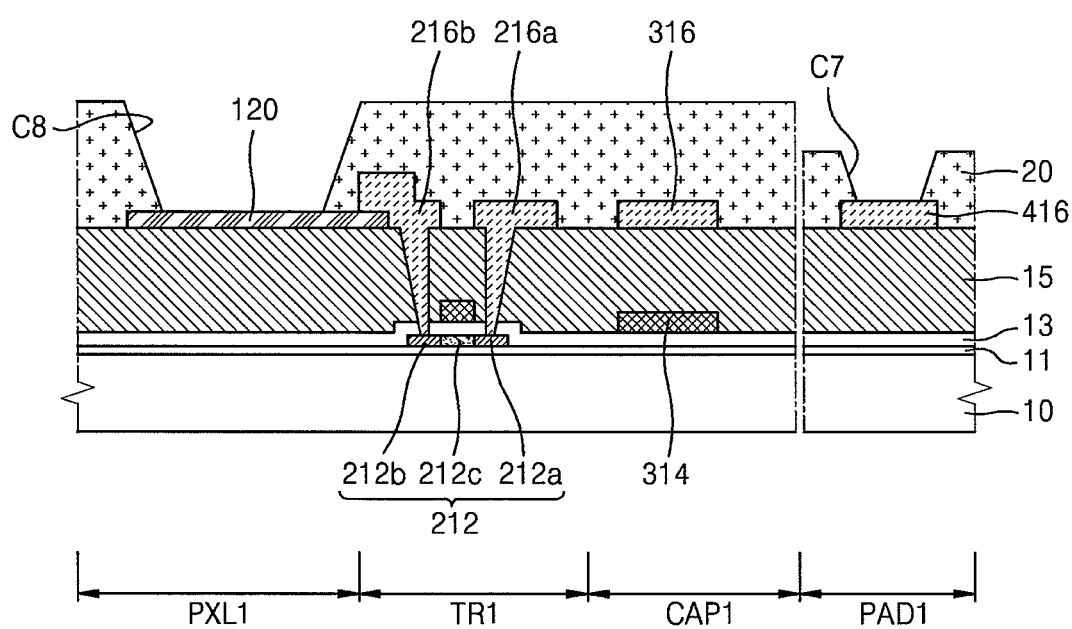
FIG. 3F is a cross-sectional view illustrating a resultant of a sixth mask process for the OLED display, according to an exemplary embodiment.

FIG. 3F is a cross-sectional view illustrating a resultant of a sixth mask process for the OLED display 1, according to an exemplary embodiment.

Referring to FIG. 3F, in the sixth mask process, the pixel-defining layer 20 is formed on the resultant of the fifth mask process shown in FIG. 3E, and an opening C8 for exposing the pixel electrode 120 and an opening C7 for exposing the pad electrode 416 are formed.

The opening C8 for exposing the top surface of the pixel electrode 120 is formed in a region that does not overlap with the thin-film transistor and the capacitor.

The pixel-defining layer 20 can be formed of an organic insulating layer formed of polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinyl alcohol-based polymer, or a combination thereof.

A thickness of the pixel-defining layer 20 can be in the range of about 50 μm to about 70 μm. By using a half-tone mask (not shown), the thickness of the pixel-defining layer 20 where the pixel-defining layer 20 covers ends of the pad electrode 416 is formed to be less than the thickness of the pixel-defining layer 20 where the pixel-defining layer 20 covers the source electrode 216a, the drain electrode 216b, and the second electrode 316 in the thin-film transistor region TR1 and the capacitor region CAP1, so that a connection error occurring at the pad electrode 416 while the external driver is connected can be decreased. However, depending on the embodiments, the thickness of the pixel-defining layer 20 can be less than about 50 μm or greater than about 70 μm.

An intermediate layer (not shown) that includes the emission layer 121 (refer to FIG. 2.) is formed on the resultant of the sixth mask process shown in FIG. 3F, and the opposite electrode 122 as a reflective electrode is formed on the emission layer 121.

In the OLED display 1 according to the first exemplary embodiment, the pixel electrode 120 formed of the translucent metal layer 120b and the opposite electrode 122 formed as the reflective electrode can form a micro-cavity structure, so that a luminescent efficiency of the OLED display 1 can be improved.

Also, even if the source electrode 216a and the drain electrode 216b are formed after the pixel electrode 120 is formed, since the source electrode 216a and the drain electrode 216b are patterned by dry etching, re-extraction of silver included in the pixel electrode 120 can be prevented thereby resulting in a decrease of particle defects.

Also, since the OLED display is manufactured by using the 6 mask processes, manufacturing costs can be reduced.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details can be made therein without departing from the spirit and scope as defined by the following claims.

What is claimed is:

1. A method of manufacturing an organic light-emitting diode (OLED) display, the method comprising:

performing a first mask process of forming an active layer of a thin-film transistor (TFT) over a substrate;

performing a second mask process of i) forming a gate insulating layer over the active layer and ii) forming a gate electrode of the TFT and a first electrode of a capacitor over the gate insulating layer;

performing a third mask process of i) forming an interlayer insulating layer over the gate electrode and ii) forming a contact hole in the interlayer insulating layer so as to expose a portion of the active layer;

performing a fourth mask process of forming a pixel electrode over the interlayer insulating layer;

performing a fifth mask process of forming source and drain electrodes a pad electrode and a second electrode of the capacitor via dry etching, wherein any one of the source and drain electrodes directly contacts a top surface of the pixel electrode, and wherein the pad electrode, the second electrode and the source and drain electrodes are formed concurrently; and performing a sixth mask process of forming a pixel-defining layer at least partially covering ends of the pixel electrode.

2. The method of claim 1, further comprising, after the second mask process, doping a region of the active layer with ion impurities, wherein the region of the active layer does not overlap the gate electrode.

3. The method of claim 1, wherein the second mask process comprises forming the gate electrode via dry etching.

4. The method of claim 1, wherein the forming of each of the source and drain electrodes comprises dry etching a first layer formed of Ti, a second layer formed of Al, and a third layer formed of Ti.

5. The method of claim 1, wherein the sixth mask process comprises forming an opening in the pixel-defining layer, and wherein the opening exposes a top surface of the pixel electrode and is formed in a region that does not overlap the TFT.

6. The method of claim 1, further comprising, after the sixth mask process:

performing a process of forming an emission layer over the pixel electrode; and performing a process of forming an opposite electrode over the emission layer.

7. The method of claim 6, wherein the pixel electrode is a translucent electrode, and wherein the opposite electrode is a reflective electrode.

8. The method of claim 6, wherein the forming of the pixel electrode comprises a first transparent conductive oxide layer, a translucent metal layer, and a second transparent conductive oxide layer sequentially stacked over the interlayer insulating layer.

9. The method of claim 8, wherein the translucent metal layer is formed of silver (Ag) or a silver ahoy.

10. The method of claim 8, wherein each of the first and second transparent conductive oxide layers is formed of at least one of indium tin oxide (ITO), indium zinc oxide (IZO), zinc oxide (ZnO), indium oxide (In2O3), indium gallium oxide (IGO), and aluminum zinc oxide (AZO).

11. The method of claim 1, wherein the pad electrode comprises a first layer formed of Ti, a second layer formed of Al, and a third layer formed of Ti, and the first to third layers are collectively patterned by dry etching.

12. A method of manufacturing an organic light-emitting diode (OLED) display, the method comprising:

performing a first mask process of forming an active layer of a thin-film transistor (TFT) over a substrate;

performing a second mask process of i) forming a gate insulating layer over the active layer and ii) forming a gate electrode of the TFT over the gate insulating layer;

performing a third mask process of i) forming an interlayer insulating layer over the gate electrode and ii) forming a contact hole in the interlayer insulating layer so as to expose a portion of the active layer;

performing a fourth mask process of forming a pixel electrode over the interlayer insulating layer;

performing a fifth mask process of forming source and drain electrodes via dry etching, wherein one of the source and drain electrodes directly contacts a top surface of the pixel electrode; and performing a sixth mask process of forming a pixel-defining layer at least partially covering ends of the pixel electrode, wherein the forming of the gate electrode comprises dry etching a first layer formed of titanium (Ti), a second layer formed of aluminum (Al), and a third layer formed of Ti.

13. A method of manufacturing an organic light-emitting diode (OLED) display, the method comprising:

performing a first mask process of forming an active layer of a thin-film transistor (TFT) over a substrate;

performing a second mask process of i) forming a gate insulating layer over the active layer and ii) forming a gate electrode of the TFT over the gate insulating layer;

performing a third mask process of i) forming an interlayer insulating layer over the gate electrode and ii) forming a contact hole in the interlayer insulating layer so as to expose a portion of the active layer;

performing a fourth mask process of forming a pixel electrode over the interlayer insulating layer;

performing a fifth mask process of forming source and drain electrodes via dry etching, wherein one of the source and drain electrodes directly contacts a top surface of the pixel electrode; and performing a sixth mask process of forming a pixel-defining layer at least partially covering ends of the pixel electrode, wherein the sixth mask process comprises forming the pixel-defining layer such that the thickness of the pixel-defining layer, where the pixel-defining layer covers ends of the pad electrode, is less than the thickness of the pixel-defining layer, where the pixel-defining layer covers the source and drain electrodes.

14. The method of claim 13, wherein the sixth mask process comprises forming the pixel-defining layer via a half-tone mask.

15. An organic light-emitting diode (OLED) display comprising:
- a substrate;
- a thin-film transistor (TFT) comprising an active layer, a gate electrode, a source electrode, and a drain electrode that are formed over the substrate;
- a capacitor comprising i) a first electrode formed on the same layer as the gate electrode and ii) a second electrode formed on the same layer as the source and drain electrodes;
- a pad electrode formed on the same layer as the source and drain electrodes;
- a pixel electrode formed at a position that does not overlap the TFT and the capacitor, wherein any one of the source and drain electrodes contacts a portion of a top surface of the pixel electrode;
- a pixel-defining layer having different thicknesses and at least partially covering ends of the pixel electrode and ends of the pad electrode;
- wherein each of the pad electrode, the source and drain electrodes, and the second electrode is formed on the same layer and is formed of the same material, and
- the gate electrode comprises a dry etched first layer formed of titanium (Ti), second layer formed of aluminum (Al), and third layer formed of Ti.

16. The OLED display of claim 15, wherein the pixel electrode is a translucent electrode, and wherein the opposite electrode is a reflective electrode.

17. The OLED display of claim 16, wherein the pixel electrode comprises a first transparent conductive oxide layer, a translucent metal layer, and a second transparent conductive oxide layer sequentially stacked over the substrate.

18. The OLED display of claim 17, wherein each of the first and second transparent conductive oxide layers is formed of at least one of indium tin oxide (ITO), indium zinc oxide (IZO), zinc oxide (ZnO), indium oxide (In2O3), indium gallium oxide (IGO), and aluminum zinc oxide (AZO).

19. The OLED display of claim 17, wherein the translucent metal layer is formed of silver (Ag) or a silver alloy.

20. The OLED display of claim 15, further comprising:
an emission layer formed over the pixel electrode; and
an opposite electrode formed over the emission layer.

* * * * *